United States Patent
Ohuchi et al.

(10) Patent No.: US 7,902,678 B2
(45) Date of Patent: Mar. 8, 2011

(54) SEMICONDUCTOR DEVICE AND MANUFACTURING METHOD THEREOF

(75) Inventors: Akira Ohuchi, Tokyo (JP); Tomoo Murakami, Tokyo (JP)

(73) Assignee: NEC Corporation, Tokyo (JP)

( * ) Notice: Subject to any disclaimer, the term of this patent is extended or adjusted under 35 U.S.C. 154(b) by 291 days.

(21) Appl. No.: 10/594,844

(22) PCT Filed: Jan. 12, 2005

(86) PCT No.: PCT/JP2005/000226
§ 371 (c)(1),
(2), (4) Date: Sep. 28, 2006

(87) PCT Pub. No.: WO2005/093817
PCT Pub. Date: Oct. 6, 2005

(65) Prior Publication Data
US 2008/0251942 A1    Oct. 16, 2008

(30) Foreign Application Priority Data
Mar. 29, 2004  (JP) ................. 2004-094309

(51) Int. Cl.
*H01L 23/498* (2006.01)
(52) U.S. Cl. .. 257/778; 257/779; 257/780; 257/E21.511; 257/E23.06
(58) Field of Classification Search ............. 257/737, 257/738, 782, E23.02, E23.021, 778–780, 257/E21.511, E23.06
See application file for complete search history.

(56) References Cited

U.S. PATENT DOCUMENTS

| | | | | |
|---|---|---|---|---|
| 5,218,234 A * | 6/1993 | Thompson et al. | ........... | 257/787 |
| 5,633,535 A * | 5/1997 | Chao et al. | ........... | 257/778 |
| 5,650,595 A * | 7/1997 | Bentlage et al. | ........... | 174/260 |
| 5,658,827 A * | 8/1997 | Aulicino et al. | ........ | 228/180.22 |
| 5,897,336 A * | 4/1999 | Brouillette et al. | ........... | 438/108 |
| 6,049,122 A * | 4/2000 | Yoneda | ........... | 257/668 |
| 6,190,940 B1 * | 2/2001 | DeFelice et al. | ........... | 438/106 |
| 6,294,840 B1 * | 9/2001 | McCormick | ........... | 257/778 |
| 6,627,998 B1 * | 9/2003 | Caletka et al. | ........... | 257/778 |
| 6,663,946 B2 * | 12/2003 | Seri et al. | ........... | 428/209 |
| 6,774,497 B1 * | 8/2004 | Qi et al. | ........... | 257/783 |
| 6,861,285 B2 * | 3/2005 | Dias | ........... | 438/108 |
| 7,005,585 B2 * | 2/2006 | Ishizaki | ........... | 174/260 |
| 7,241,675 B2 * | 7/2007 | Savastiouk et al. | ........... | 438/597 |

(Continued)

FOREIGN PATENT DOCUMENTS

JP    2000-138255 A    5/2000

(Continued)

*Primary Examiner* — Leonardo Andújar
*Assistant Examiner* — William Harriston
(74) *Attorney, Agent, or Firm* — Sughrue Mion, PLLC

(57) ABSTRACT

Electrode pads (5) and a solder resist (7) are disposed on the upper surface of a wiring board (1), and apertures (7*a*) are formed in the solder resist (7) so as to expose the electrode pads (5). Electrodes (4) are disposed on the lower surface of a semiconductor element (2). Electrodes (4) are connected to the electrode pads (5) by way of bumps (3). An underfill resin (6) is disposed in the area that excludes the solder resist (7) and the bumps (3) in the space between the wiring board (1) and the semiconductor element (2). Between the wiring board (1) and the semiconductor element (2), the thickness (B) of the solder resist (7) is equal to or greater than the thickness (A) of the underfill resin (6) on the solder resist (7). The volume (Vb) of the bumps (3) is less than the volume (Vs) of the apertures (7*a*).

14 Claims, 8 Drawing Sheets

U.S. PATENT DOCUMENTS

| | | | |
|---|---|---|---|
| 7,247,508 B2 * | 7/2007 | Higashitani et al. | 438/17 |
| 7,474,006 B2 * | 1/2009 | Maeda | 257/778 |
| 7,535,095 B1 * | 5/2009 | En et al. | 257/701 |
| 7,547,579 B1 * | 6/2009 | Jiang | 438/118 |
| 7,575,999 B2 * | 8/2009 | Benson et al. | 438/637 |
| 2002/0033525 A1 * | 3/2002 | Ohuchi | 257/679 |
| 2002/0060084 A1 * | 5/2002 | Hilton et al. | 174/52.1 |
| 2003/0109080 A1 * | 6/2003 | Dias | 438/108 |
| 2003/0111737 A1 * | 6/2003 | Katagiri et al. | 257/777 |
| 2004/0046252 A1 * | 3/2004 | Fujimori et al. | 257/734 |
| 2004/0155358 A1 * | 8/2004 | Iijima | 257/778 |
| 2004/0201096 A1 * | 10/2004 | Iijima et al. | 257/734 |
| 2004/0209451 A1 * | 10/2004 | Kukimoto et al. | 438/612 |
| 2004/0214375 A1 * | 10/2004 | Naitoh | 438/117 |
| 2004/0232562 A1 * | 11/2004 | Hortaleza et al. | 257/778 |
| 2006/0043570 A1 * | 3/2006 | Muramatsu et al. | 257/698 |
| 2008/0149369 A1 * | 6/2008 | Kawamura et al. | 174/251 |
| 2008/0236876 A1 * | 10/2008 | Kodama et al. | 174/260 |

FOREIGN PATENT DOCUMENTS

| | | |
|---|---|---|
| JP | 2001-332583 A | 11/2001 |
| JP | 2002-057186 A | 2/2002 |
| JP | 2002256288 * | 9/2002 |
| JP | 2002-343829 A | 11/2002 |
| JP | 2003-179100 A | 6/2003 |
| JP | 2004-103928 A | 4/2004 |

* cited by examiner

SEMICONDUCTOR DEVICE AND MANUFACTURING METHOD THEREOF

This application claims priority from PCT Application No. PCT/JP2005/000226 filed Jan. 12, 2005, and from Japanese Patent Application No. 2004-094309 filed Mar. 29, 2004, which applications are incorporated herein by reference.

TECHNICAL FIELD

The present invention relates to a semiconductor device in which a semiconductor element is mounted on the wiring board and fabricated by sealing the gap between the semiconductor element and the wiring board with the aid of an underfill resin, and to a manufacturing method thereof; and more particularly relates to a semiconductor device having a flip chip or chip size package, or another mounted structure, and to a manufacturing method thereof.

BACKGROUND ART

As electronic equipment becomes more compact, lightweight, and high-performance, flip chip mounting is becoming more widespread as a method for mounting LSI (Large Scale Integrated circuit) chips and other semiconductor elements to a wiring board. Flip chip mounting is a mounting method in which bumps are formed on the surface of a wiring pattern of a semiconductor element, and the bumps are joined to the electrodes of the wiring board.

FIGS. 7A to 7D are cross-sectional views showing the manufacturing steps a conventional method of manufacturing a semiconductor device. First, a wiring board 1 and a semiconductor element 2 are prepared, as shown in FIG. 7A. A plurality of electrode pads 5 are formed on one of the surfaces of the wiring board 1, and a solder resist 7 is disposed in the peripheral area of the electrode pads 5 on the surface of the wiring board 1. Also, a plurality of electrodes 4 are formed on one of the surfaces of the semiconductor element 2. Bumps 3 are formed on the electrodes 4 of the semiconductor element 2 and on the electrode pads 5 of the wiring board 1. Flux 8 is deposited on the surface on which the electrode pads 5 are formed in the wiring board 1. The flux 8 is deposited so as to cover the electrode pads 5 and the bumps 3 formed on the electrode pads 5. In this case, the flux 8 is occasionally deposited at the distal end of the bumps 3 formed on the semiconductor element 2.

Next, the semiconductor element 2 is positioned on the wiring board 1 so that the bumps 3 formed on the semiconductor element 2 are in contact with the bumps 3 formed on the wiring board 1, and the bumps 3 are reflowed to fuse and solidify them together, as shown in FIG. 7B. The bumps 3 on the semiconductor element 2 and the bumps 3 on the wiring board 1, which are in mutual contact, are thereby integrated, and the electrodes 4 of the semiconductor element 2 are connected to the electrode pads 5 of the wiring board 1 by way of the bumps 3.

Next, the mounted article in which the semiconductor element 2 is mounted on the wiring board 1 is washed and the flux 8 is removed, as shown in FIG. 7C. Resin material in the form of a liquid is caused to permeate and fill the gap between the wiring board 1 and semiconductor element 2 with the aid of the capillary effect, as shown in FIG. 7D. In this case, resin material is deposited on the periphery of the semiconductor element 2 and in the gap on the wiring board 1. The resin material is cured by heating, and an underfill resin 6 is formed between and on the periphery of the wring substrate 1 and the semiconductor element 2, as well as on the periphery of the semiconductor element 2. A semiconductor device is thereby fabricated.

In such a semiconductor device, high connection reliability is required in the connection portion between the wiring board and the semiconductor element. In other words, a semiconductor element must be stably connected to the wiring board over a long period time without damaging the connection. For this reason, a resin material is sufficiently filled and cured to form an underfill resin in the gap between the semiconductor element and wiring board to thereby protect the connection portion between the semiconductor element and the wiring board. The physical properties of the underfill resin, such as the modulus of elasticity and the coefficient of thermal expansion, must be improved, and stress applied to the connection portion, which is one form of thermal stress caused by the difference in the coefficient of thermal expansion between the semiconductor element and wiring board, must be reduced. However, the size of LSIs is currently being increased in conjunction with demands for higher LSI performance. As a result, the effect of heat stress generated between the semiconductor element and the wiring board is further magnified. For this reason, sufficient connection reliability cannot be obtained without further improving the physical properties of the underfill resin.

This type of problem can be solved by including, for example, a large amount of filler in the underfill resin, and ensuring a higher modulus of elasticity and a lower coefficient of thermal expansion in the underfill resin. However, since the viscosity of the resin material increases prior to curing when a filler is included, a problem occurs in which the resin material cannot be sufficiently filled in the gap between the semiconductor element and wiring board. Also, even if the resin material can be sufficiently filled into the gap, the bumps, electrodes, and electrode pads are plastically deformed by heat stress generated when the device operates or at other times in cases in which, for example, voids are produced in the gap between the semiconductor element and wiring board, or at other times, and there is a risk that adjacent bumps will occasionally become connected via the voids to form a short circuit.

Thus, there are difficult problems in that the modulus of elasticity, the coefficient of thermal expansion, and other physical properties of the underfill resin, and the gap filling characteristics of the resin materials must all be kept at the desired level in order to improve the connection reliability of a semiconductor device. The above-described problems are predicted to become more significant because the filling distance that the resin material must penetrate is increased and the gap between the semiconductor element and wiring board becomes narrower as the size of LSI increases and the pitch is reduced.

In view of the above, a mounting method has been proposed in response to such problems. In this method, solder connections are formed and resin is cured by applying a resin material for forming an underfill resin in advance on the wiring board, mounting the semiconductor element on the wiring board, and thereafter performing heat treatment (refer to Patent Document 1, for example). FIGS. 8A to 8C are cross-sectional views showing the order of the steps of this conventional method for manufacturing a semiconductor device. First, bumps 3 are formed on the electrodes 4 of the semiconductor element 2 as a pre-step for mounting the semiconductor element 2 on the wiring board 1, as shown in FIG. 8A. Electrode pads 5 are formed on the surface of the wiring board 1, and a solder resist 7 is disposed on the periphery of the electrode pads 5.

The wiring board 1 is mounted on a stage (not shown), the surface of the side on which the semiconductor element 2 is mounted on the wiring board 1 is set facing upward, and resin material 6a for forming an underfill resin is applied on this surface in an amount that sufficiently fills the area between the semiconductor element and wiring board when the semiconductor element 2 is mounted on the wiring board 1, as shown in FIG. 8B.

Next, a bonding tool (not shown) is attached to the semiconductor element 2, the surface on which the electrodes 4 are formed is held so that it faces downward, and the semiconductor element 2 is positioned on the wiring board 1, as shown in FIG. 8C. The semiconductor element 2 is pressed to the wiring board 1 so that the bumps 3 displace the resin material 6a and make contact with the electrode pads 5. The semiconductor element 2 is heated by using a heater or another heating means provided to the bonding tool to which the semiconductor element 2 is attached, the wiring board 1 is heated by using a heater or another heating means provided to the stage on which the wiring board 1 is mounted, the bumps 3 are reflowed to connect the electrodes 4 of the semiconductor element 2 and the electrode pads 5 of the wiring board 1 by way of the bumps 3, and the resin material 6a is heat cured to form an underfill resin 6. Mounting of the semiconductor element 2 is thereby completed.

[Patent Document 1] Japanese Laid-open Patent Application No. 2001-332583

DISCLOSURE OF THE INVENTION

Problems that the Invention is to Solve

However, the prior art described in Patent Document 1 described above has the following problems. The first problem is that sufficient connection reliability cannot be obtained when voids are generated in the underfill resin between the semiconductor element and wiring board. The cause of voids lies in the fact that because resin material is already filled between the semiconductor element and the wiring board prior to reflowing, volatile components generated from the wiring board or other sources are left behind in the underfill resin due to the wiring board or other components being heated during reflow. When voids are generated in the underfill resin, the bumps are plastically deformed by heat stress generated during device operation and at other times, adjacent bumps make contact with each other in some cases, and short-circuiting is liable to occur. For this reason, the connection reliability of the semiconductor device is reduced.

The second problem is that a stable solder connection cannot be attained. The reason for this is that resin material is applied to the wiring board prior to soldering and connecting the connection portions. In other words, because resin material for underfill resin formation is already present in the periphery of the bumps during reflow of the solder bumps, the resin material undergoes curing during reflow of the solder bumps, the viscosity increases, and the resin material whose viscosity has increased when the solder has melted prevents the solder from wetting the electrode pads. When silica or other flux is added to the resin material in order to improve the connection reliability, not only is the viscosity of the resin material further increased, but the filler further erodes the connection portion whereby the wettability of the solder on the electrode pads is even further reduced.

In this case, an effective means for improving solder connectivity is one in which a load is added during reflowing to promote solder wetting on the electrode pads, but there is a problem in that when the load is continuously applied after the solder has melted, the melted solder bumps become crushed and make contact with an adjacent bump, resulting in a short-circuit.

The present invention was contrived in view of the above-described problems, and an object of the present invention is to provide a semiconductor device having high connection reliability and a stable connection between the wiring board and semiconductor element, and to provide a method for manufacturing the semiconductor device, in a semiconductor device fabricated by sealing a resin between a semiconductor element and a wiring board, and in a manufacturing method thereof.

Means of Solving the Problems

The semiconductor device according to the present invention comprises a wiring board in which electrode pads are formed on the surface thereof; a semiconductor element which is disposed on the wiring board and in which electrodes are formed on the surface thereof; bumps for connecting the electrodes to the electrode pads; and an underfill resin filled between the wiring board and the semiconductor element to embed the bumps, wherein the wiring board comprises a solder resist disposed on the surface of the side on which the electrode pads are formed, apertures for exposing the electrode pads are formed on the solder resist, and the thickness of the solder resist in the area excluding the area directly above the electrode pads is equal to or greater than the thickness of the underfill resin disposed on the solder resist in the area between the wiring board and the semiconductor element.

In the present invention, since the thickness of the solder resist is equal to or greater than the underfill resin disposed on the solder resist, 50% or more of the connection portion comprising the electrode pads, bumps, and electrodes is covered by the solder resist, allowing deformation of the bumps due to heat stress to be reduced and short-circuiting between bumps to be prevented even if voids are generated in the underfill resin.

In this case, the thickness of the underfill resin disposed on the solder resist is preferably 50 μm or less. The solder resist is thereby not required to be excessively thick, the apertures in the solder resist are not required to be excessively deep, and bump formation is therefore facilitated.

The volume of the bumps is preferably less than the volume of the apertures. When the bumps are melted and joined to the electrodes or electrode pads, the bumps are not crushed as a result and do not flow from the apertures to become connected to other bumps, even if the bumps are melted while a load is applied in order to improve connection reliability. Therefore, the bumps do not short-circuit to each other, a load can be applied, and a stable connection can be obtained between the electrode pads, bumps, and electrodes.

The thickness of the solder resist is preferably 30 μm or more. The volume of the apertures is thereby increased and made to be somewhat greater than the volume of the bumps. Therefore, the connection reliability between the electrode pads and electrodes can be improved.

The method for manufacturing a semiconductor device according to the present invention is a method for manufacturing a semiconductor device having a wiring board in which electrode pads are formed on the surface thereof, and a semiconductor element in which electrodes are formed on the surface thereof, wherein the wiring board comprises a solder resist disposed on the surface of the side on which the electrode pads are formed, and provided with apertures for exposing the electrode pads, the method comprising a step for forming bumps on at least one element selected from the electrode pads and the electrodes; a step for depositing a liquid resin material on at least a portion of the area in which the semiconductor element is to be mounted on the wiring board; a step for pressing the semiconductor element to the wiring board to connect the electrode pads, the bumps, and the electrodes to each other; a step for melting and then solidifying the bumps to join the electrodes to the electrode pads by way of the bumps; and a step for curing the resin material and forming an underfill resin so that the bumps become embedded between the wiring board and the semiconductor element, wherein the distance between the wiring board and the semiconductor element is controlled during the melting of the bumps in the joining step, and the thickness of the solder resist in the area excluding the area directly above the electrode pads is equal to or greater than the thickness of the underfill resin disposed on the solder resist in the area between the wiring board and the semiconductor element after the underfill resin has been formed.

In the step for forming the bumps, the volume of the umps is preferably less than the volume of the apertures. When the bumps are melted and joined to the electrodes or electrode pads, the bumps are not crushed as a result and do not flow from the apertures to become connected to other bumps, even if the bumps are melted while a load is applied in order to improve connection reliability. Since a load can be applied to the bumps while preventing the bumps from short-circuiting with each other, poor connections are not liable to occur due to resin material present between the joining portions, even if the electrode pads and electrodes are joined after resin material has been deposited on the wiring board. For this reason, the connection reliability of the connection portion can be improved.

Furthermore, in the joining step, the distance between the wiring board and semiconductor element may be controlled by controlling the relative position of the semiconductor element with respect to the wiring board. Alternatively, in the joining step, the bumps may be melted while the semiconductor element is being pressed to the wiring board, and the distance between the wiring board and the semiconductor element may be controlled by controlling the pressing force.

EFFECTS OF THE INVENTION

In accordance with the present invention, 50% or more of the connection portion can be covered by the solder resist, and the occurrence of short-circuiting between bumps can be prevented by making the thickness of the solder resist to be equal to or greater than the thickness of the underfill resin disposed on the solder resist. The electrodes can thereby be stably connected to the electrode pads by way of the bumps, and a semiconductor device having high connection reliability can be obtained.

Description of the reference numerals

Figure 1A:
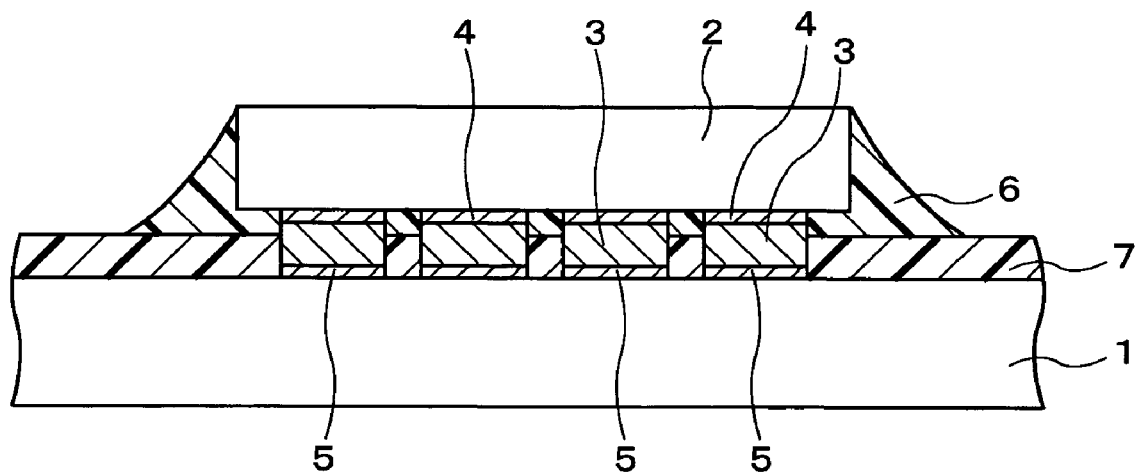
FIG. 1A is a cross-sectional view showing the semiconductor device according to the first embodiment of the present invention.

1: wiring board
2: semiconductor element
3: bumps
4: electrodes
5: electrode pads
6: underfill resin
6a: resin material
7: solder resist
7a: aperture portions
8: flux
A: thickness of the underfill resin 6 on the solder resist 7
B: thickness of the solder resist 7
C: sum of the heights of the electrode pads 5 and bumps 3
D: height of the bumps 3

BEST MODE FOR CARRYING OUT THE INVENTION

Figure 1B:
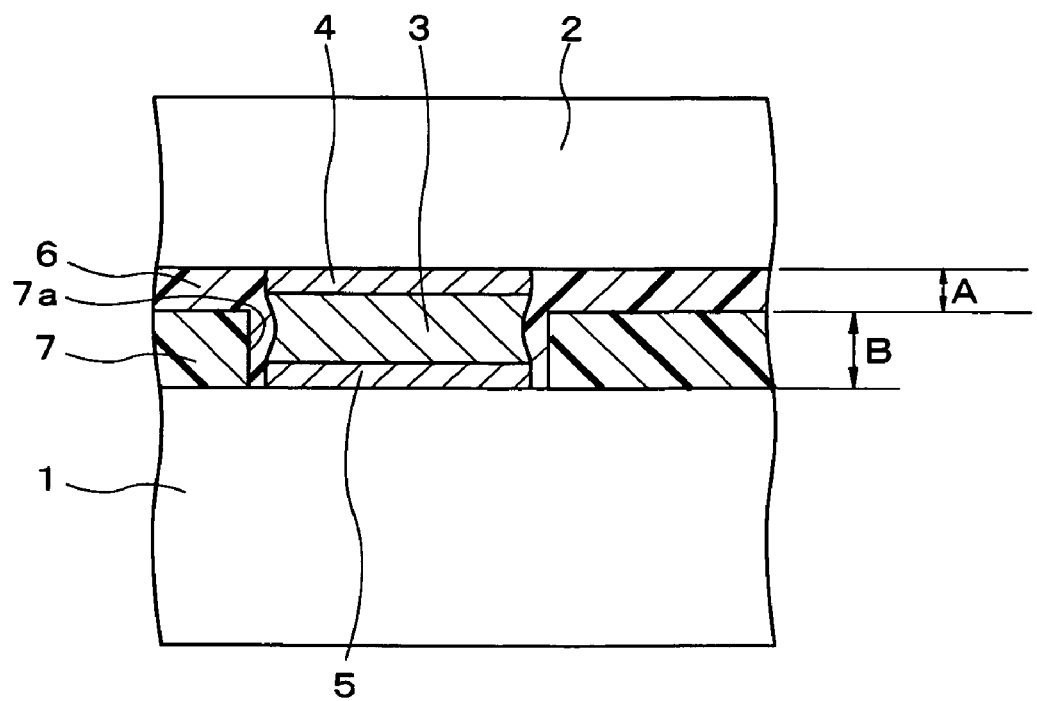
FIG. 1B is an enlarged cross-sectional view showing a part of the connection portion of the semiconductor device.

Embodiments of the present invention are described in detail below with reference to the attached diagrams. The present embodiment is an embodiment of the semiconductor device. The first embodiment of the present invention is described first. FIG. 1A is a cross-sectional view showing the semiconductor device according to the present embodiment, and FIG. 1B is an enlarged cross-sectional view showing a part of the connection portion of the semiconductor device. In the semiconductor device according to the present embodiment, a wiring board 1 is provided, and a plurality of electrode pads 5 are disposed on the upper surface of the wiring board 1, as shown in FIGS. 1A and 1B. Also, a solder resist 7 is disposed on the surface of the wiring board 1. Aperture portions 7a are formed in the areas corresponding to the area directly above the electrode pads 5 in the solder resist 7, and a single electrode pad 5 is disposed inside each of the aperture portions 7a of the solder resist 7 as viewed from the vertical direction to the surface of the wiring board 1 (hereinafter referred to as "as viewed from above"). The electrode pads 5 are thereby exposed in the aperture portions 7a. In other words, a solder resist 7 is disposed in the peripheral area of the electrode pads 5 on the surface of the wiring board 1.

An LSI or another semiconductor element 2 is disposed above the wiring board 1. A plurality of electrodes 4 are formed on the lower surface of the semiconductor element 2, i.e., the surface facing the wiring board 1. The electrodes 4 are in the same position as the electrode pads 5 of the wiring board 1 as viewed from above. The thicknesses of the electrodes 4 and electrode pads 5 are mutually equal, for example.

The surfaces of the electrodes 4 and electrode pads 5 are flat. Bumps 3 are disposed between the electrodes 4 and electrode pads 5, which are in the same position as viewed from above, and the electrodes 4 are electrically connected to the electrode pads 5 by way of the bumps 3. The connection portions are formed by the electrode pads 5, bumps 3, and electrodes 4. The height of the connection portions is greater than the thickness of the solder resist 7, at twice the thickness of the solder resist 7 or less. In FIG. 1A, the connection portion shows only four connections for simplicity in diagramming, but the present invention is not limited to four connections, and a greater number of connections is ordinarily provided.

Underfill resin 6 is disposed in the areas covering the side portion of the semiconductor element 2 on the wiring board 1, and the portions excluding the bumps 3 in the space between the wiring board 1 and semiconductor element 2. Between the wiring board 1 and the semiconductor element 2, the thickness B of the solder resist 7 is equal to or greater than the thickness A of the underfill resin 6 on the solder resist 7, i.e., $A \leq B$. For this reason, the volume of the lower portion covered by the solder resist 7 in the connection portion is 50% or more of the volume of the entire connection portion. Since the thicknesses of the electrodes 4 and electrode pads 5 are equal to each other, 50% or more of the bumps 3 is covered about the periphery by the solder resist 7.

The underfill resin 6 fills the space between the solder resist 7 and semiconductor element 2. Therefore, the thickness A is equal to the distance between the upper surface of the solder resist 7 and the lower surface of the semiconductor element 2. Also, the sum (A+B) of the thickness B of the solder resist 7 and the thickness A of the underfill resin 6 positioned on the solder resist is equal to the height of the connection portion, and the distances between the portions excluding the solder resist 7 and electrode pads 5 on the wiring board 1, and the portions excluding electrodes 4 on the semiconductor element 2 are equal.

The thickness A of the underfill resin 6 is preferably 50 μm or less. By setting the thickness A of the underfill resin 6 to be 50 μm or less, the thickness B of the solder resist 7 is no longer required to be excessive because the relation $A \leq B$ described above is satisfied. The aperture portions 7a of the solder resist 7 can thereby be prevented from being made excessively deep, the bumps 3 are no longer required to be made excessively large, and the formation of the bumps 3 can therefore be facilitated.

The specific dimensions of the above-described distances are determined by the size and pitch of the electrodes 4 and electrode pads 5. When the shapes of the electrodes 4 and electrode pads 5 as viewed from above are circular shapes in which the diameter is 100 to 200 μm, or rectangular shapes in which the length of one side is 100 to 200 μm, for example, and the pitch of the electrodes 4 and electrode pads 5 is 0.2 to 0.5 mm, the thickness B of the solder resist 7 is selected to be 30 μm or more ($B \geq 30$ μm), and the thickness A of the underfill resin 6 is selected to be 50 μm or less ($A \leq 50$ μm), having satisfied the condition that the thickness B of the solder resist 7 is equal to or greater than the thickness A of the underfill resin 6 ($B \geq A$).

The volume Vb of the bumps 3 is less than the volume Vs of the aperture portions 7a of the solder resist 7, i.e., Vs>Vb. The volume of the connecting body (Vb+Ve+Vp) is preferably less than the volume Vs of the aperture portions 7a of the solder resist 7, wherein Ve is the volume of the electrodes 4, and Vp is the volume of the electrode pads 5, i.e., preferably Vs>Vb+Ve+Vp.

The thickness B of the solder resist 7 is preferably 30 μm or more. The bumps 3 thereby no longer need to be excessively small in order to satisfy the relationship Vs>Vb described above, and the volume of the bumps 3 can be made somewhat large. As a result, the connection reliability between the electrodes 4 and electrode pads 5 can be increased.

The bumps 3 are formed from solder, i.e., Sn—Pb eutectic crystal solder, Sn—Pb non-eutectic crystal solder, Sn—Ag solder, Sn—Cu solder, Sn—Sb solder, Sn—Zn solder, Sn—Bi solder, or a low-melting metal material obtained by adding specific additional elements to these solders. In particular, Sn—Pb eutectic solder, Sn—Ag—Cu solder, and the like are advantageous, but no limitation is necessarily imposed thereby. The electrodes 4 of the semiconductor element 2 and the electrode pads 5 of the wiring board 1 are formed from a single-layer Cu film or (Au/Ni) bilayer film having good solder wettability.

A liquid resin material filled in the gap between the semiconductor element and the wiring board is cured to form the underfill resin 6. A thermosetting resin is used as the main component of the resin material for forming the underfill resin 6, and an inorganic bulking agent (filler) having a mass percent of 0 to 65 is preferably used. The reason that 0 mass % is set as the lower limit of the suitable range of content of the inorganic filler is to indicate that an inorganic filler does not need to be included in the underfill resin 6; and the reason that the upper limit is 65 mass % is due to the fact that solder connectivity declines not only because the increase in the viscosity of the resin material is significant when this level is exceeded, but also because of a reduction in the resin components that act to remove an oxide film. Silica filler or the like is preferably used as the inorganic filler, but other inorganic fillers may be used without particular limitation.

Examples of the thermosetting resin, which is the base material of the underfill resin 6, that can be used include epoxy resin, polyester resin (unsaturated polyester, a combination of unsaturated polyester and a compound having an active hydrogen radical, or the like), and acrylate resin (including (meth)acryloxypropyl polysiloxane or another silicon acrylate, and epoxy acrylate). Also, α-cyanoacrylate or another adhesive or the like that cures at normal temperature can be used as the resin material for forming the underfill resin 6.

It is possible to use an accelerator that reacts with the thermosetting resin during heat curing to accelerate curing, a radical initiator whereby radicals that cure the thermosetting resin are generated by heating, and an anionic initiator, a cationic initiator, or another curing agent. These may be used singly or as a combination of two or more agents in the resin material for forming the underfill resin 6.

A chemical capable of removing an oxide film, e.g., an organic acid or another metal surface cleaning agent, may be added to the resin material for forming the underfill resin 6. Chemicals that produce components capable of removing an oxide film during the curing reaction of the resin material may also be added. The resin material is thereby made into an active resin material capable of removing an oxide film by being heated, and the use of flux is no longer required, particularly when connecting Cu electrodes to each other or Cu electrode pads and bumps, which are elements that can be readily oxidized.

A generally commercially available solder resist may be used as the solder resist 7. Examples of commercial products that may be used are commercial products manufactured by Taiyo Ink Manufacturing and Tamura Kaken.

The effects of the present embodiment are described next. In the present embodiment, the deformation of the bumps 3 due to heat stress can be reduced, and solder short-circuiting and other problems can be made less likely to occur even if voids are generated in the underfill resin 6 because 50% or more of the bumps 3 is covered by the solder resist 7. The connection reliability can thereby be improved. In the present embodiment, since the volume Vs of the aperture portions 7a of the solder resist 7 is greater than the volume Vb of the bumps 3, the melted bumps 3 do not flow from inside the apertures 7 to make contact with other bumps 3 and the bumps 3 do not short-circuit with each other when the semiconductor element 2 is mounted on the wiring board 1, even if a load is applied in the direction that brings the semiconductor element 2 and wiring board 1 closer to each other while the bumps 3 are reflowed. For this reason, a semiconductor device that has a highly reliable and stable connection portion can be obtained.

Figure 2:
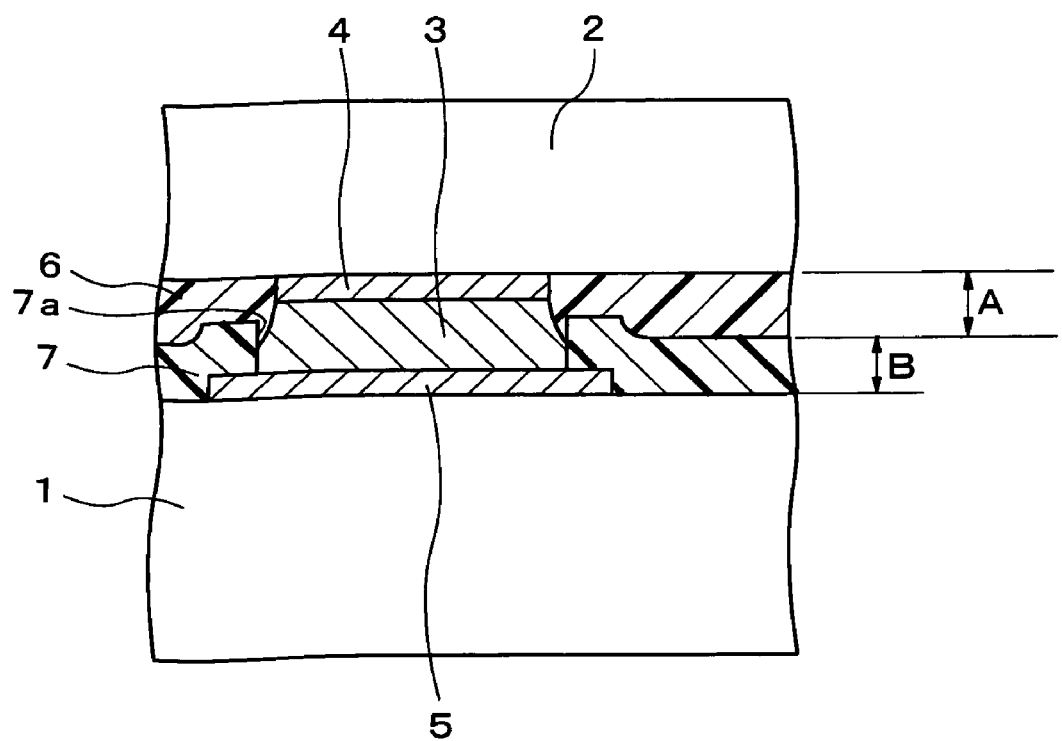
FIG. 2 is an enlarged cross-sectional view showing a part of the connection portion of the semiconductor device according to the second embodiment of the present invention.

The second embodiment of the present invention is described next. FIG. 2 is an enlarged cross-sectional view showing a part of the connection portion of the semiconductor device according to the present embodiment. In the semiconductor device according to the present embodiment, the edges of the solder resist 7 are set on the edges of the electrode pads 5 on the wiring board 1, as shown in FIG. 2. In other words, the peripheral portion of the electrode pads 5 is covered by the solder resist 7. The bumps 3 are in contact with the side surface of the aperture portions 7a of the solder resist 7. As viewed from above, the electrode pads 5 are larger that the electrodes 4.

In this case, the thickness B of the solder resist 7 described above in the first embodiment is defined as the thickness of the portion of the solder resist 7 that is not disposed on the electrode pads 5, and the thickness A of the underfill resin 6 is defined as the thickness of the portion of the underfill resin 6 that corresponds to the area directly above the portion of the solder resist 7 that is not disposed on the electrode pads 5. Thus, $A \leq B$ in the same manner as the first embodiment described above. For this reason, the volume of the lower portion covered by the solder resist 7 in the connection portion is 50% or more of the volume of the entire connection portion. When the thicknesses of the electrodes 4 and electrode pads 5 are mutually equal, 50% or more of the bumps 3 is covered about the periphery by the solder resist 7.

The volume Vs of the aperture portions 7a of the solder resist 7 described above in the first embodiment is the volume of the portion that excludes the electrode pads 5 in the aperture portions 7a. The volume Vs is greater than the volume Vb of the bumps 3; i.e., Vs>Vb. When the volume of the electrodes 4 is Ve, it is preferred that Vs>Vb+Ve. The configuration and effects other than those described above in the present embodiment are the same as those in the first embodiment described above.

Figure 3A:
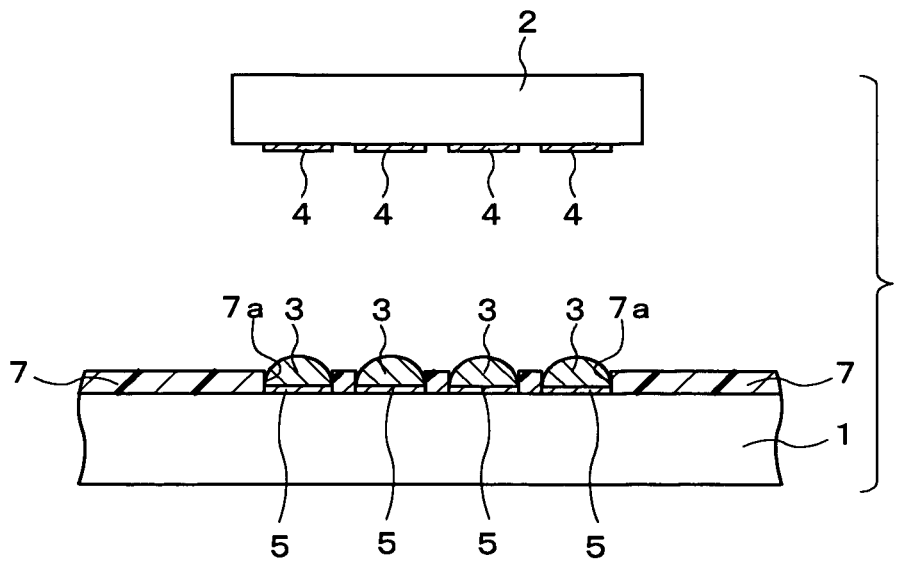
FIGS. 3A to 3C are cross-sectional views showing the order of the steps of the method for manufacturing the semiconductor device according to the third embodiment of the present invention.
Figure 3B:
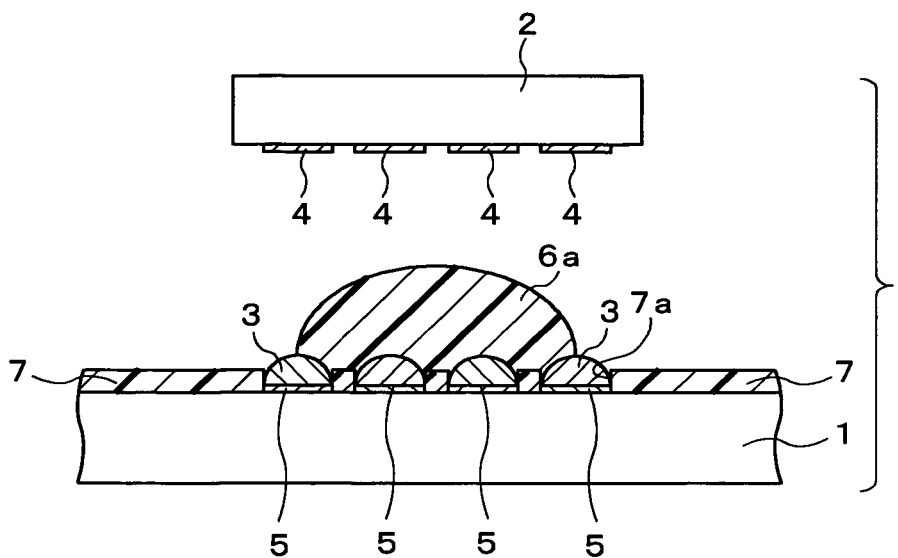
Figure 3C:
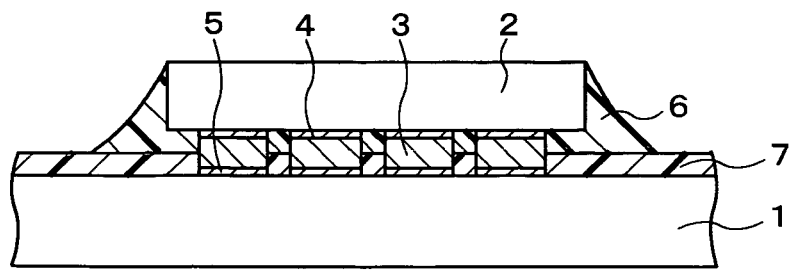
Figure 4A:
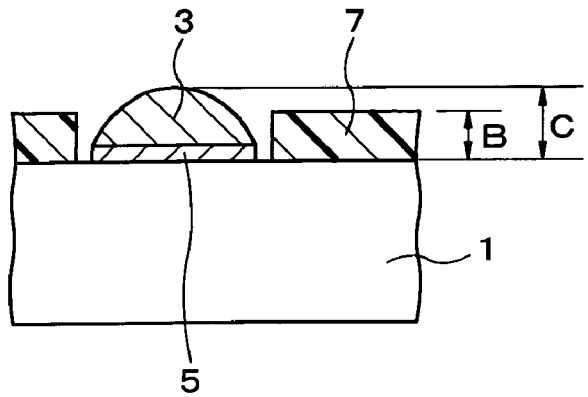
FIGS. 4A to 4C are partially enlarged cross-sectional views showing the method for manufacturing the semiconductor device according to the present embodiment.
Figure 4B:
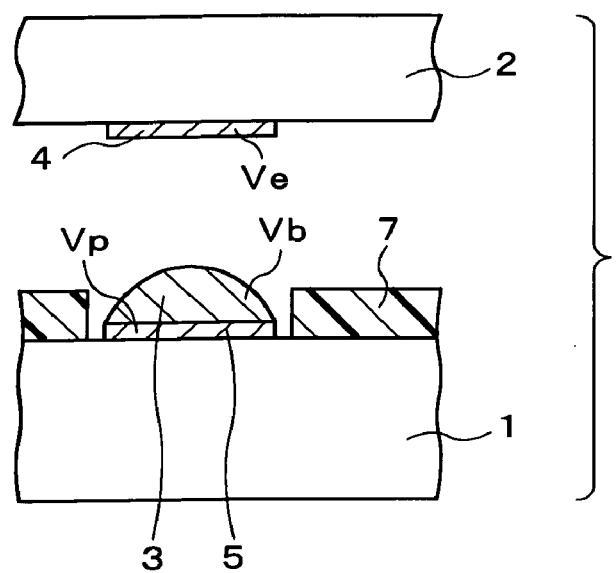
Figure 4C:
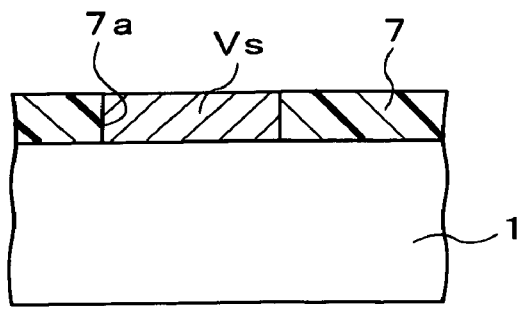

The third embodiment of the present invention is described next. The present embodiment is an embodiment of the method for manufacturing a semiconductor device according to the first embodiment described above. FIGS. 3A to 3C are cross-sectional views showing the order of the steps of the method for manufacturing the semiconductor device according to the present embodiment. FIGS. 4A to 4C are partially enlarged cross-sectional views showing the method for manufacturing the semiconductor device according to the present embodiment.

First, a plurality of electrode pads 5 are formed on the surface to prepare a wiring board 1 in which a solder resist 7 is disposed on the periphery of the electrode pads 5, as shown in FIG. 3A. The surface of the electrode pads 5 is flat. The thickness of the solder resist 7 is 30 µm or more, for example. Aperture portions 7a are formed in the area that corresponds to the area directly above the electrode pads 5 in the solder resist 7, and the electrode pads 5 are exposed in the aperture portions 7a. The wiring board 1 is mounted on a stage (not shown) having an internally mounted heater, for example, so that the surface on which the electrode pads 5 and solder resist 7 are disposed face upward. A bump 3 comprising solder is formed on each of the electrode pads 5. Also, a semiconductor element 2 is prepared in which electrodes 4 are formed on the surface. The surfaces of the electrodes 4 are flat.

In this case, the sum C of the heights of the electrode pads 5 and bumps 3 is greater than the thickness B of the solder resist 7, as shown in FIG. 4A, i.e., C>B. The volume Vb of the bumps 3 shown in FIG. 4B is less than the volume Vs of the aperture portions 7a of the solder resist 7 shown in FIG. 4C, i.e., Vs>Vb. The sum of the volumes of the electrodes 4, bumps 3, and electrode pads 5 (Ve+Vb+Vp) is more preferably less than the volume Vs of the aperture portions 7a, wherein Ve is the volume of the electrodes 4 and Vp is the volume of the electrode pads 5, as shown in FIG. 4B; i.e. Vs>Ve+Vb+Vp.

Next, a resin material 6a is deposited for forming an underfill resin in the area in which the semiconductor element 2 is to be mounted on the wiring board 1, as shown in FIG. 3B. The resin material 6a is a liquid resin material, and an active resin is used, for example. The resin material 6a may, for example, be one in which chemicals having a flux effect are added to the thermosetting resin, which is the base material, and may be a resin material capable of removing an oxide film from the surface of the solder bumps 3 as well as the electrodes 4 and electrode pads 5, which are connection members to be soldered.

The method for depositing the resin material 6a on the wiring board 1 may, for example, be a one in which a single drop of resin material 6a is dropped in the center area of the wiring board 1. In the case that the semiconductor element 2 is large, the method may be one in which the resin material 6a is applied so as to form an "X" on the diagonal of the mounting area, or may be one in which the resin material 6a is divided into several drops which are dropped onto the wiring board 1.

Next, the semiconductor element 2 is attached to a bonding tool (not shown) in which a heater is housed, for example, and is held with the surface on which the electrodes 4 are formed facing downward. The semiconductor element 2 is positioned on the wiring board 1 by using the bonding tool, and the semiconductor element 2 is positioned with respect to the wiring board 1 so that the electrodes 4 of the semiconductor element 2 are positioned directly above the electrode pads 5 of the wiring board 1.

Next, the semiconductor element 2 is pressed against the wiring board 1 while a prescribed load is applied, as shown in FIG. 3C. The electrodes 4 of the semiconductor element 2 are brought into contact with the bumps 3. The electrode pads 5, bumps 3, and electrodes 4 are thereby connected to each other. In this case, the liquid resin material 6a is pressed between the wiring board 1 and semiconductor element 2 and pushed aside by the bumps 3, and the gap between the wiring board 1 and semiconductor element 2 is filled. The resin material 6a is also disposed in the area that covers the side portion of the semiconductor element 2 on the wiring board 1.

Next, a load is applied to the semiconductor element 2 in the direction facing the wiring board 1 while the bumps 3 are heated and melted using at least one heater selected from the heater housed in the stage and the heater housed in the bonding tool. The melted bumps 3 thereby wet the surface of the electrodes 4. After the bumps 3 have melted, the application of the load is stopped, and the position of the semiconductor element 2 is controlled by the bonding tool. In other words, the bonding tool controls the relative position of the semiconductor element 2 with respect to the wiring board 1. In this case, the distance A between the upper surface of the solder resist 7 and the lower surface of the semiconductor element 2 is set so as to be equal to or less than the thickness B of the solder resist 7, as shown in FIG. 1B. The heater is thereafter switched off, and the bumps 3 are cooled and solidified. The electrodes 4 are thereby electrically connected and mechanically joined to the electrode pads 5 by way of the bumps 3. The connection portion comprising the electrode pads 5, bumps 3, and electrodes 4 is thereby formed.

The mounted components comprising the wiring board 1, bumps 3, and semiconductor element 2 are subsequently placed for a prescribed length of time in a constant-temperature chamber or the like that has been set to a prescribed temperature to heat and cure the resin material 6a and form an underfill resin 6. In this case, the distance A described above is the thickness of the portion of the underfill resin 6 that corresponds to the portion on the solder resist 7 in the gap between the wiring board 1 and the semiconductor element 2. The semiconductor element 2 is thereby mounted on the wiring board 1, and the semiconductor device according to the first embodiment described above is manufactured.

The effects of the present embodiment are described below. In the present embodiment, the bumps 3 are brought into contact with the electrodes 4 and melted, and the distance between the wiring board 1 and semiconductor element 2 is thereafter adjusted by using the bonding tool to control the position of the semiconductor element 2. The thickness A of the underfill resin 6 described above can thereby be easily controlled.

In the present embodiment, since resin material 6a is deposited on the wiring board 1 prior to mounting the semiconductor element 2 on the wiring board 1, the resin material does not need to be sealed in the gap between the wiring board 1 and the semiconductor element 2 after the semiconductor element 2 is mounted on the wiring board 1. Therefore, a material having a high modulus of elasticity and a low coefficient of thermal expansion can be used as the resin material, and the connection reliability of the semiconductor device is improved. Also, the flux in the gap does not need to be washed because the resin material is easily sealed. Since the height of the bumps does not need to be made higher than necessary and the gap between the wiring board 1 and semiconductor element 2 does not need to be increased in order to facilitate the sealing of the resin material, the semiconductor device can be made very thin.

In the present embodiment, the volume Vb of the bumps 3 is made less than the volume Vs of the aperture portions 7a of the solder resist 7. Therefore, the melted bumps 3 do not flow to the exterior of the aperture portions 7a to make contact and short-circuit with other bumps 3.

In this case, since the thickness B of the solder resist 7 is 30 μm or more in the present embodiment, the volume Vs of the aperture portions 7a can be made somewhat larger, and the relationship Vs>Vb described above can be satisfied even without making the volume Vb of the bumps 3 excessively low. When the bumps 3 on the electrode pads 5 are formed, the distance that the peak of the bumps 3 protrudes from the upper surface of the solder resist 7 can be kept fairly large and the distal end of the bumps 3 can be more easily brought into contact with the electrodes 4. As a result, the connection reliability between the electrode pads 5 and electrodes 4 can be improved.

In the present embodiment, the formation of an oxide film on the surface of the bumps 3 and on the surface of the electrodes 4 associated with heating during the solder connection can be reduced by the fluxing effect of the active resin itself without the use of flux. This is achieved by using an active resin as the resin material 6a for forming the underfill resin. As a result, the connection reliability between the bumps 3 and electrodes 4 is improved. Also, chemicals that are added to the resin material and are capable of removing an oxide film from the solder are caused to form a bond with the resin material and are chemically stabilized after the resin has been cured. Therefore, the underfill resin after curing can be endowed with sufficient electrical insulation properties.

In the present embodiment, an example was shown in which the bumps 3 were brought into contact with the electrodes 4 and melted, a load was applied thereafter, and the thickness A of the underfill resin 6 was controlled by using the bonding tool to control the position of the semiconductor element 2, but the present embodiment is not limited thereby. In other words, a load may be continuously applied to the wiring board 1 and semiconductor element 2 even after the bumps 3 have been melted, and the bumps 3 may be reflowed while the semiconductor element 2 is pressed toward the wiring board 1. The resin material 6a can thereby be prevented from entering between the bumps 3 and electrodes 4, and the connection of the connection portion can be improved. The semiconductor device can also be made thinner while assuring the connection reliability of the connection portion.

In this case, since the volume Vb of the bumps 3 is less than the volume Vs of the aperture portions 7a of the solder resist 7 in the present embodiment, the melted solder does not flow to the exterior of the aperture portions 7a to make contact and short-circuit with other bumps 3, even if the bumps 3 are reflowed while the semiconductor element 2 is pressed toward the wiring board 1.

Thus, in accordance with the present embodiment, a resin material capable of removing an oxide film from solder is applied to the wiring board 1 in advance, and short-circuiting in the bumps and other problems can be prevented in advance even if the bumps 3 are reflowed while a load is applied. Stable bump connections are made possible by optimizing the relationship between the sum C of the heights of the electrode pads 5 and the bumps 3 and the thickness B of the solder resist 7 in the manner described above. The relationship between the volume Vb of the bumps 3 and the volume Vs of the aperture portions 7a of the solder resist 7 can be optimized as described above.

Figure 5A:
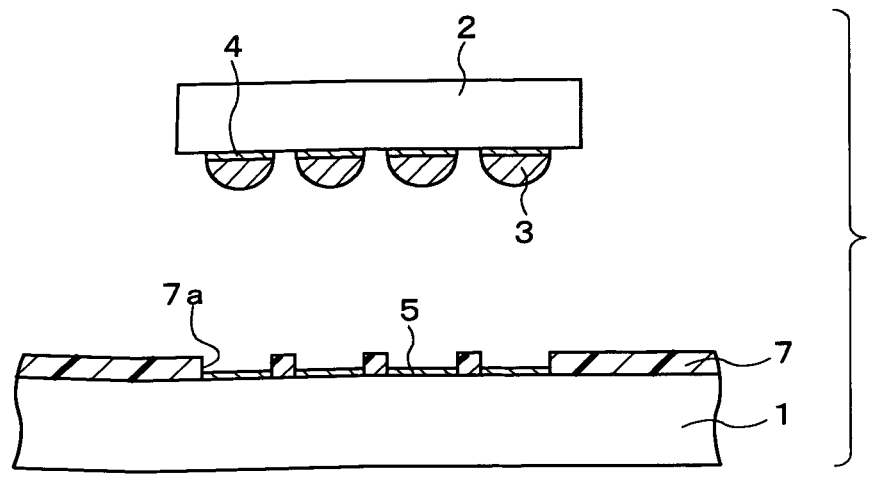
FIGS. 5A to 5C are cross-sectional views showing the order of the steps of the method for manufacturing the semiconductor device according to the fourth embodiment of the present invention.
Figure 5B:
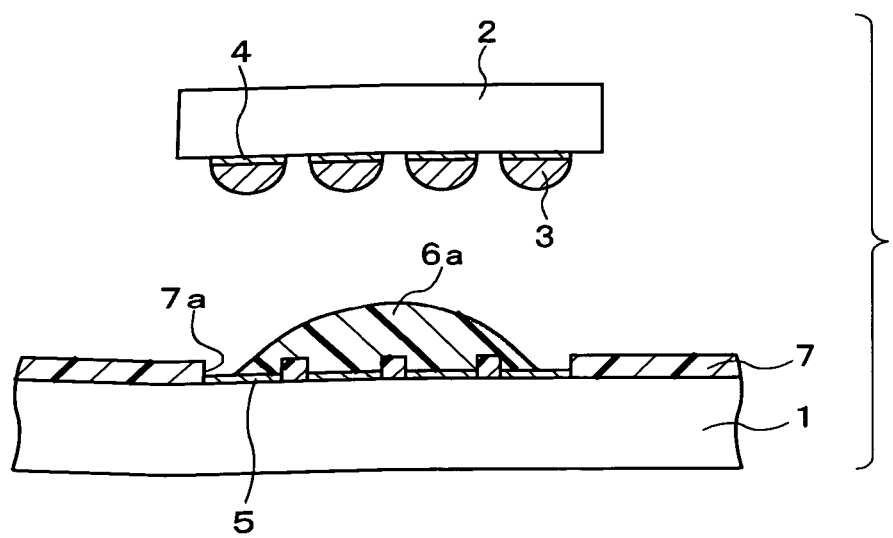
Figure 5C:
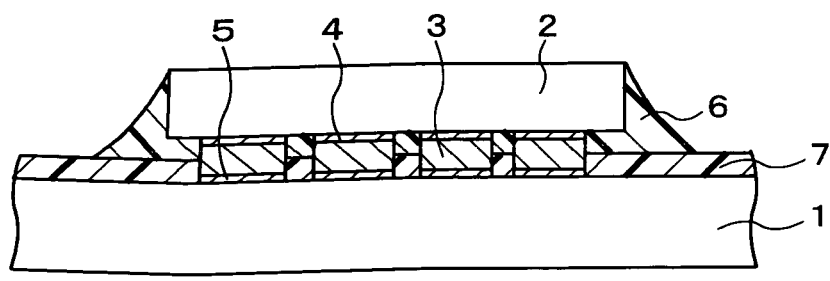

The fourth embodiment of the present invention is described next. FIGS. 5A to 5C are cross-sectional views showing the order of the steps of the method for manufacturing the semiconductor device according to the present embodiment. In the third embodiment described above, bumps 3 are formed on the electrode pads 5 of the wiring board 1, but in the present embodiment, the bumps 3 are formed on the electrodes 4 of the semiconductor element 2, as shown in FIG. 5A. In this case, the sum of the heights of the electrodes 4 and bumps 3 is made to be greater than the thickness of the solder resist 7, and the volume (Vb) of the bumps 3 is made to be less than the volume (Vs) of the aperture portions 7a of the solder resist 7.

The resin material 6a is deposited in the area in which the semiconductor element 2 is to be mounted on the wiring board 1, as shown in FIG. 5B. The semiconductor element 2 is subsequently pressed to the wiring board 1 and the bumps 3 are brought into contact with the electrode pads 5, as shown in FIG. 5C. The semiconductor element 2 is thereafter kept pressed to the wiring board 1, the bumps 3 are reflowed, and the bumps 3 are connected to the electrode pads 5. The distance between the wiring board 1 and semiconductor element 2 is controlled after the bumps 3 have been melted, and the distance between the upper surface of the solder resist 7 and the lower surface of the semiconductor element 2 is adjusted. The bumps 3 are then cooled and solidified. The electrodes 4 are thereby connected to the electrode pads 5 by way of the bumps 3. The resin material 6a is subsequently heated and cured to form the underfill resin 6. The semiconductor device according to the first embodiment described above can thereby be manufactured. The configuration and effects other than those described above in the present embodiment are the same as those in the third embodiment described above.

Figure 6A:
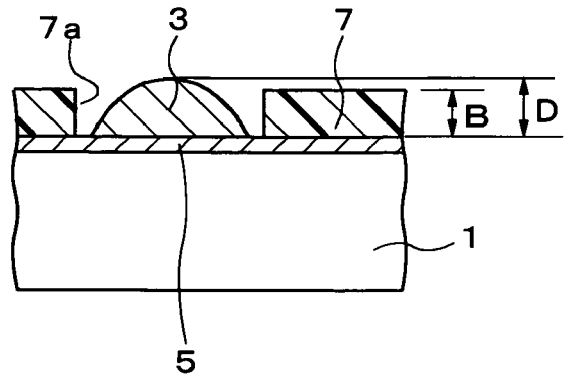
FIGS. 6A to 6C are partially enlarged cross-sectional views showing the method for manufacturing the semiconductor device according to the fifth embodiment of the present invention.
Figure 6B:
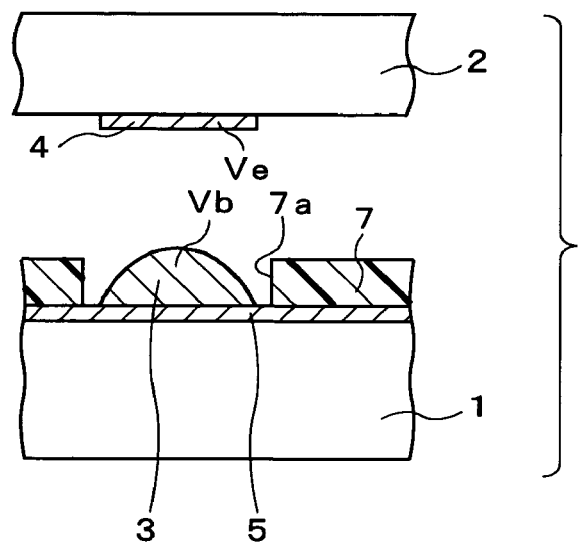
Figure 6C:
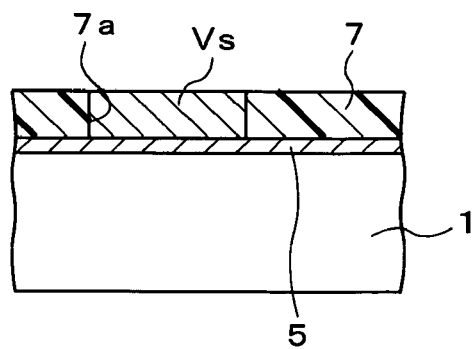
Figure 7A:
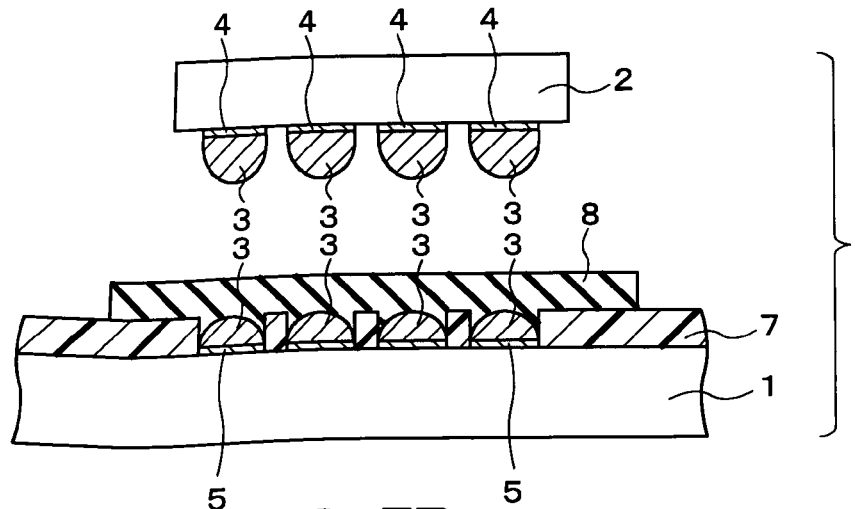
FIGS. 7A to 7D are cross-sectional views showing the order of the steps of a conventional method for manufacturing a semiconductor device.
Figure 7B:
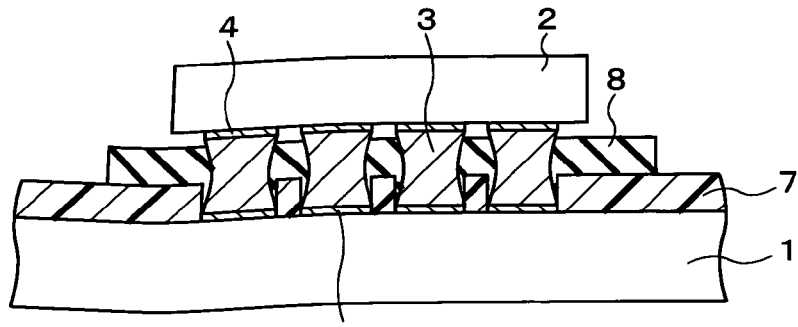
Figure 7C:
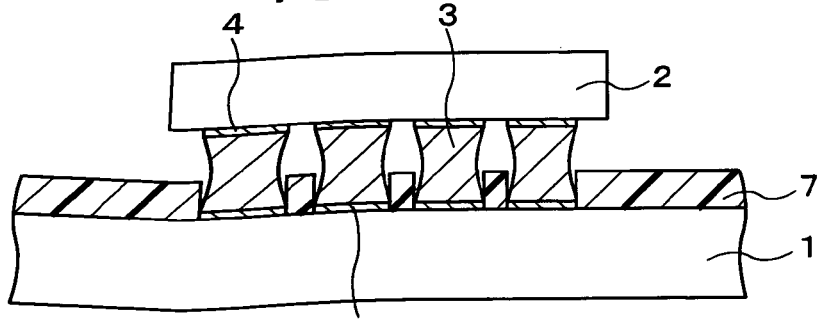
Figure 7D:
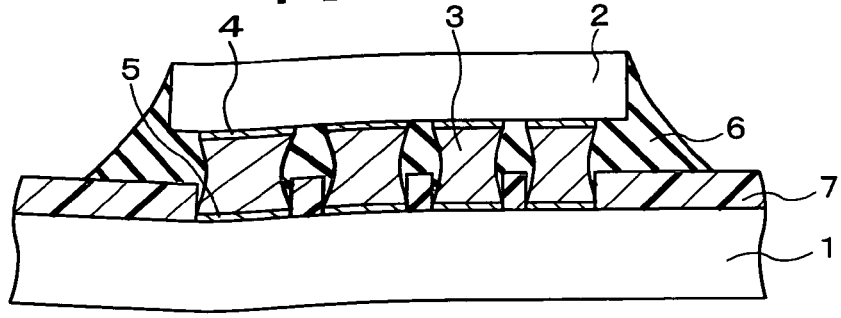
Figure 8A:
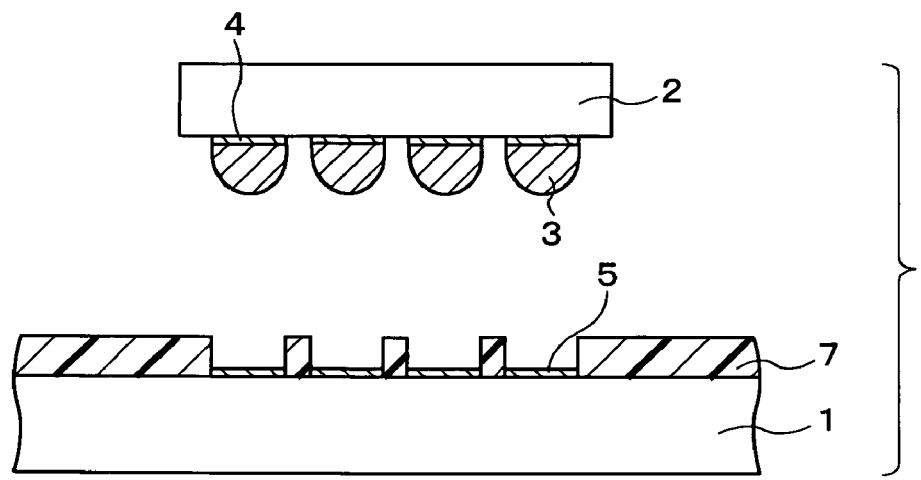
FIGS. 8A to 8C are cross-sectional views showing the order of the steps of another conventional method for manufacturing a semiconductor device.
Figure 8B:
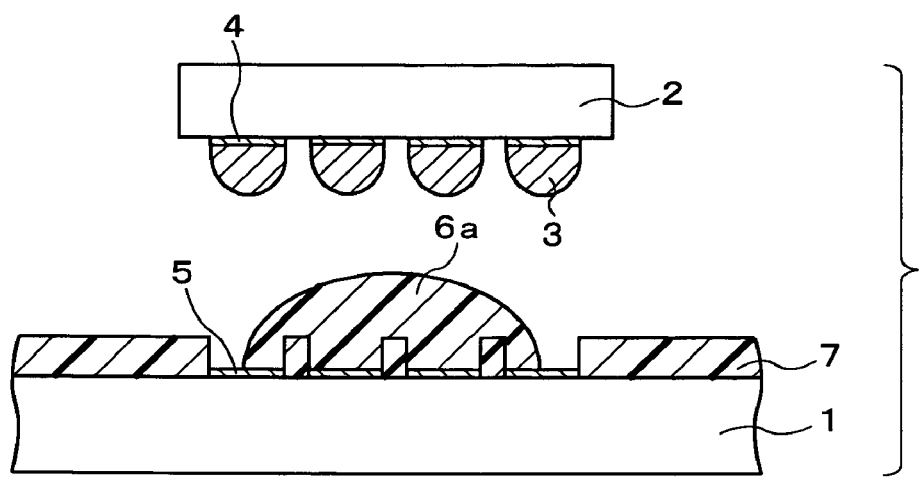
Figure 8C:
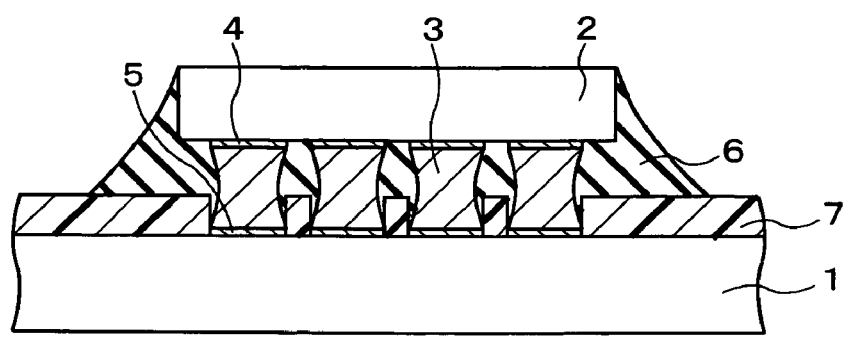

The fifth embodiment of the present invention is described next. The present embodiment is an embodiment of the method for manufacturing the semiconductor device according to the second embodiment described above. FIGS. 6A to 6C are partially enlarged cross-sectional views showing the method for manufacturing the semiconductor device according to the present embodiment. The present embodiment is different from the third embodiment described above in that the edges of the solder resist 7 are disposed on the edges of the electrode pads 5 on the wiring board 1, as shown in FIG. 6A.

In the present embodiment, the height D of the bumps 3 is made to be greater than the thickness B of the solder resist 7 in a step prior to reflowing the bumps 3, as shown in FIG. 6A. The volume Vb of the bumps 3 is made to be less than the volume Vs, where Vs is the volume of the aperture portions 7a of the solder resist 7 excluding the volume of electrode pads 5, as shown in FIGS. 6B and 6C; i.e., Vs>Vb. The sum of the volume Vb of the bumps 3 and the volume Ve of the electrodes 4 (Vb+Ve) is more preferably made less than the volume Vs of the aperture portions 7a; i.e., Vs>Vb+Ve. The configuration other than that described above in the present embodiment is the same as the third embodiment described above. The semiconductor device according to the second embodiment described above can thereby be manufactured. The effects other than those described above in the present embodiment are the same as those in the third embodiment described above.

In the third to fifth embodiments described above, examples were shown in which the bumps 3 were formed on the electrode pads 5 of the wiring board 1 or on the electrodes 4 of the semiconductor element 2, but the bumps 3 may be formed on both the electrode pads 5 and the electrodes 4.

In the third to fifth embodiments described above, examples were shown in which the bumps 3 were reflowed by using the heater housed in the stage or bonding tool, but the present invention in not limited to this configuration, and the bumps 3 may, for example, be reflowed by passing an assembly comprising the wiring board 1, bumps 3, and semiconductor element 2 through a reflow oven heated to a prescribed temperature. In this case as well, the reliability of the connection portion can be further improved when connections are formed while a load is applied to the wiring board 1 and semiconductor element 2 in the mutually approaching direction.

In the third to fifth embodiments described above, at least one surface selected from the surface on which the electrode pads 5 are formed on the wiring board 1 and the surface on which the electrodes 4 are formed on the semiconductor element 2 may be subjected to plasma treatment or the like to reform the surface after the bumps 3 have been formed and before the resin material 6a has been deposited on the wiring board 1. The connection of the bumps 3 can thereby be improved.

In the first to fifth embodiments described above, examples were shown in which the surface of the electrodes 4 of the semiconductor element 2 were flat, but the present invention is not limited to this configuration, and convexities may be formed on the surface of the electrodes 4. The connection strength between the electrodes 4 and bumps 3 can thereby be improved.

Examples

The effects of the examples of the present invention are described in detail next with reference to comparative examples that are outside the scope of the claims of the present invention. A semiconductor device according to the first embodiment described above was manufactured using the method described in the third embodiment described above. First, a plurality of electrode pads 5 were formed on the surface, as shown in FIG. 3A, and five wiring boards 1 were prepared in which a solder resist 7 was disposed on the periphery of the electrode pads 5. The shape of the wiring boards 1 was square as viewed from above, with a length of 45 mm and a width of 45 mm. The shape of the electrode pads 5 was circular as viewed from above, with a diameter of 135 μm. The array pitch of the electrode pads 5 was 240 μm. A commercially available product manufactured by Tamura Kaken was used as the solder resist 7 of the wiring board 1, and the thickness of the solder resist, i.e., the thickness B shown in FIG. 4A, was 30 μm while the diameter of the aperture portions 7a of the solder resist 7 was about 150 μm.

Five semiconductor elements 2 in which a plurality of electrodes 4 were formed on the surface were prepared. The shape of the semiconductor elements 2 was square as viewed from above, with a length of 14.8 mm and a width of 14.8 mm. Bilayer (Au/Ni) plating was performed on the surface of the electrodes 4. The shape of the electrodes 4 was circular as viewed from above, with a diameter of 135 μm. The array pitch of the electrode pads 5 was 240 μm. In other words, the electrodes 4 and electrode pads 5 were mutually superimposed as viewed from above. A polyimide film was disposed in the area in which the electrodes 4 were not formed on the surface of the semiconductor elements 2, and the polyimide film caused the surface of the electrodes 4 to be depressed about 2 μm from the area in which the electrodes 4 were not formed on the surface of the semiconductor elements 2. The wiring structure of the wiring board 1 and semiconductor element 2 was designed to allow electrical connections to be checked after mounting.

Bumps 3 were then formed on the electrode pads 5. The bumps 3 were formed from lead-free solder containing copper as well as 3 mass % Sn and 0.5 mass % Ag. In this case, the sum of the heights of the electrode pads 5 and bumps 3, i.e., the height C shown in FIG. 4A, was bumps were not formed on the electrodes 4 of three semiconductor elements 2 of the five semiconductor elements 2. The same bumps as those formed on the electrode pads 5 of the electrodes 4 were formed on the remaining two semiconductor elements 2.

Next, the wiring boards 1 were disposed on stages (not shown), and about 20 mg of the resin material 6a was deposited in the area in which the semiconductor element 2 were to be mounted on the wiring board 1 by using a dispenser (not shown), as shown in FIG. 3B. A thermosetting resin capable of removing an oxide film, i.e. an active resin containing chemicals capable of removing an oxide film, was used as the resin material 6a. Specifically, the resin material 6a was a material in which the main component was a liquid epoxy resin to which a phenolic curing agent was added in an amount equal to 30 to 40 mass % of the main component.

In this case, a resin material to which silica filler, which is an inorganic filler, was added in an amount equal to 65 mass % of the main component was deposited on two wiring boards 1 of the five wiring boards 1; a resin material to which silica filler was added in an amount equal to 30 mass % of the main component was deposited on another wiring board 1; and a resin material to which silica filler was not added was deposited on the remaining two wiring boards 1.

Next, the above-described five wiring boards 1 and five semiconductor elements 2 were assembled to fabricate five semiconductor devices in the manner shown in FIG. 3C. TABLE 1 shows the amount of filler used in the underfill resin in the semiconductor devices. As shown in TABLE 1, example No. 1 is one in which a semiconductor element 2 on which bumps are not formed is mounted on a wiring board 1 on which resin material 6a containing 65 mass % of silica filler has been deposited; example No. 2 is one in which a semiconductor element 2 on which bumps are not formed is mounted on a wiring board 1 on which resin material 6a containing 30 mass % of silica filler has been deposited; and example No. 3 is one in which a semiconductor element 2 on which bumps are not formed is mounted on a wiring board 1 on which resin material 6a that does not contain silica filler has been deposited.

Comparative example No. 4 is one in which a semiconductor element 2 on which bumps have been formed is mounted on a wiring board 1 on which resin material 6a containing 65 mass % of silica filler has been deposited; and comparative example No. 5 is one in which a semiconductor element 2 on which bumps have been formed is mounted on a wiring board 1 on which resin material 6a that does not contain silica filler has been deposited.

The semiconductor element 2 was attached to a bonding tool and positioned on the wiring board 1, and the semiconductor element 2 was pressed against the wiring board 1. At this point, in example nos. 1 to 3 in which bumps were not formed on the semiconductor element 2, the devices were heated to a temperature of 240° C. using the heater tool of a mounter while a pressing force of 2 g per bump was applied for 5 seconds. The bumps 3 were thereby reflowed to connect the electrodes 4 and electrode pads 5 with each other by way of the bumps 3. On the other hand, in comparative example nos. 4 and 5 in which bumps were formed on the semiconductor element 2, the devices were heated to 240° C. in the same manner as example nos. 1 to 3, but because the bumps short-circuit with each other when a load was continuously applied when the bumps were joined, the application of a load was stopped after the bumps melted, and an attempt was to establish a connection by controlling the position of the semiconductor element 2.

Next, the mounted articles in which the semiconductor elements 2 were connected to the wiring boards 1 were placed in a thermostat for 120 minutes at a temperature of 150° C. in a normal atmosphere. The resin material 6a was thereby cured and an underfill resin 6 was formed. Semiconductor devices were manufactured thereby.

The thickness of the portion above the solder resist 7 between the wiring board 1 and semiconductor element 2 in the underfill resin 6, i.e., the thickness A shown in FIG. 1B was measured, and the thickness A was an average of 10 μm and a maximum of 30 μm in the semiconductor devices in which bump-free semiconductor elements 2 were used, i.e., the semiconductor devices of example nos. 1 to 3. In contrast, in the semiconductor devices in which bump-equipped semiconductor elements 2 were used, i.e., the semiconductor devices of comparative example nos. 4 and 5, the thickness A was an average of 80 μm. The results are shown in TABLE 1.

Next, the five semiconductor devices fabricated in the manner described above were evaluated for solder connectivity, reflow durability, and temperature cycle durability. The evaluation results are shown in TABLE 1. In TABLE 1, "○" indicates a good evaluation result, "X" indicates a poor evaluation result, and "-" indicates that an evaluation was not performed.

First, the solder connectivity was evaluated. The evaluation of the solder connectivity was performed by searching for the existence of unconnected bump locations. The results are shown in TABLE 1. In comparative example No. 4, the existence of unconnected bump locations was confirmed, as shown in TABLE 1. In contrast, in example nos. 1 to 3 and comparative example no. 5, all of the connection portions were electrically connected, and the solder connectivity was good.

Reflow durability was evaluated next. The evaluation of reflow durability was performed by passing all of the semiconductor devices, excluding comparative example no. 4 in which unconnected locations occurred during the joining step, were passed through a reflow oven three times at a maximum temperature of 250° C., and the condition after this process was examined. As a result, the occurrence of voids was confirmed in all of the semiconductor devices, but the occurrence of short-circuiting between bumps by way of the voids after reflowing was confirmed in comparative example no. 5. Short-circuiting between bumps was not found in example nos. 1 to 3, and the reflow durability was good.

The temperature cycle durability was subsequently evaluated. The evaluation of the temperature cycle durability was performed by executing a temperature cycle in which the three semiconductor devices, i.e., the semiconductor devices of example nos. 1 to 3 with good reflow durability, were subjected to repeated heating and cooling in a range of −40° C. to +125° C., and the devices were checked for the occurrence of a connection failure after 1,000 cycles. As a result, example nos. 1 to 3 did not experience a connection failure even after 1,000 cycles, and good connection states were maintained. In other words, examples nos. 1 to 3 exhibited good temperature cycle durability.

TABLE 1

| | | SEMICONDUCTOR DEVICE | | | |
| | | BUMPS | | UNDERFILL FILLER | |
| | No. | WIRING BOARD | SEMICONDUCTOR ELEMENT | AMOUNT (MASS %) | THICKNESS (μm) |
| EXAMPLE | 1 | YES | NO | 65 | AVERAGE: 10 |
| | 2 | YES | NO | 30 | MAXIMUM: 30 |
| | 3 | YES | NO | 0 | |
| COMPARATIVE | 4 | YES | YES | 65 | AVERAGE: |

TABLE 1-continued

| EXAMPLE | 5 | YES | YES | 0 | 80 |
|---------|---|-----|-----|---|-----|

| | No. | EVALUATION RESULT | | |
|---|---|---|---|---|
| | | CONNECTIVITY | REFLOW DURABILITY | TEMPERATURE CYCLE DURABILITY |
| EXAMPLE | 1 | ∤ | ∤ | ∤ |
| | 2 | ∤ | ∤ | ∤ |
| | 3 | ∤ | ∤ | ∤ |
| COMPARATIVE EXAMPLE | 4 | X | — | — |
| | 5 | ∤ | X | — |

As described above, example nos. 1 to 3 were configured so that the thickness B of the solder resist 7 was 30 μm, the thickness A of the underfill resin 6 was 30 μm or less, and the condition A≦B was satisfied. Therefore, the solder connectivity, reflow durability, and temperature cycle durability were good. In contrast, comparative example nos. 4 and 5 were configured so that the thickness B of the solder resist 7 was 30 μm, the thickness A of the underfill resin 6 was 80 μm, and the condition A≦B was not satisfied. Therefore, the solder connectivity and reflow durability were poor. In this manner, the connection reliability of example nos. 1 to 3 of the present invention was superior to comparative example nos. 4 and 5 without regard to the type of underfill resin. As a result, the present invention was confirmed to be advantageous.

INDUSTRIAL APPLICABILITY

The present invention can be advantageously used in a semiconductor device in which a semiconductor element is mounted on a wiring board and the connection portions of the two are sealed by using an underfill resin, and in a manufacturing method thereof; and can more particularly be advantageously used in a semiconductor device having a flip chip or chip size package, or another mounted structure, and in a manufacturing method thereof.

The invention claimed is:

1. A semiconductor device comprising:
   a wiring board in which electrode pads are formed on a surface thereof;
   a semiconductor element which is disposed on the wiring board and in which electrodes are formed on the surface thereof;
   bumps for connecting said electrodes to said electrode pads; said bumps being formed from solder; and
   an underfill resin filled between said wiring board and said semiconductor element to embed said bumps, wherein said wiring board comprises a solder resist disposed on the surface of the side on which said electrode pads are formed;
   wherein apertures for exposing said electrode pads are formed on the solder resist;
   wherein the thickness of said solder resist in the area excluding the area directly above said electrode pads is equal to or greater than the thickness of said underfill resin disposed on said solder resist in said area between said wiring board and said semiconductor element,
   wherein the solder resist overlaps the electrode pads in a solder mask defined structure when viewed from a direction normal to the surface of the wiring board, and
   wherein the volume of said bumps is less than the volume of said apertures.

2. The semiconductor device according to claim 1, wherein the thickness of said underfill resin disposed on said solder resist is 50 μm or less.

3. The semiconductor device according to claim 1, wherein the thickness of said solder resist is 30 μm or more.

4. A method for manufacturing a semiconductor device having a wiring board in which electrode pads are formed on a surface thereof, and a semiconductor element in which electrodes are formed on the surface thereof, wherein said wiring board comprises a solder resist which is disposed on the surface of the side on which said electrode pads are formed, and which is provided with apertures for exposing said electrode pads, said method comprising the steps of:
   forming bumps on at least one element selected from said electrode pads and said electrodes;
   depositing a liquid resin material on at least a portion of the area in which said semiconductor element is to be mounted on said wiring board;
   pressing said semiconductor element to said wiring board to connect said electrode pads, said bumps, and said electrodes to each other;
   melting and then solidifying said bumps to join said electrodes to said electrode pads by way of said bumps; and
   curing said resin material and forming an underfill resin so that said bumps become embedded between said wiring board and said semiconductor element,
   wherein the distance between said wiring board and said semiconductor element is controlled during the melting of said bumps in said joining step, and the thickness of said solder resist in the area excluding the area directly above said electrode pads is equal to or greater than the thickness of said underfill resin disposed on said solder resist in said area between said wiring board and said semiconductor element after said underfill resin has been formed,
   wherein the solder resist overlaps the electrode pads in a solder mask defined structure when viewed from a direction normal to the surface of the wiring board, and
   wherein the volume of said bumps is less than the volume of said apertures in the step for forming said bumps.

5. The method for manufacturing a semiconductor device according to claim 4, wherein the thickness of said solder resist is 30 μm or more.

6. The method for manufacturing a semiconductor device according to claim 4, wherein the distance between said wiring board and semiconductor element is controlled by controlling the relative position of said semiconductor element with respect to said wiring board in said joining step.

7. The method for manufacturing a semiconductor device according to claim 4, wherein a resin material to which a chemical capable of removing an oxide film is added is used as said resin material.

8. The method for manufacturing a semiconductor device according to claim 4, further comprising a step of carrying out plasma treatment on at least one surface selected from the surface on the side on which said electrode pads are formed on said wiring board, and the surface on the side on which said electrodes are formed on said semiconductor element, between the forming of said bumps and the depositing of said resin material.

9. The semiconductor device according to claim 1, wherein the thickness of the solder resist is about 30 μm.

10. The semiconductor device according to claim 1, wherein the thickness of the solder resist in the area excluding the area directly above the electrode pads is at least four times greater than the thickness of the underfill resin disposed on the solder resist in the area between the wiring board and the semiconductor element.

11. The method for manufacturing a semiconductor device according to claim 4, wherein the thickness of the solder resist is about 30 μm.

12. The method for manufacturing a semiconductor device according to claim 4, wherein the thickness of the solder resist in the area excluding the area directly above the electrode pads is at least four times greater than the thickness of the underfill resin disposed on the solder resist in the area between the wiring board and the semiconductor element.

13. The semiconductor device according to claim 1, wherein the solder resist overlaps the electrode pads at outer peripheral end portions of the electrode pads, when viewed from the direction normal to the surface of the wiring board.

14. The method for manufacturing a semiconductor device according to claim 4, wherein the solder resist overlaps the electrode pads at outer peripheral end portions of the electrode pads, when viewed from the direction normal to the surface of the wiring board.

* * * * *

UNITED STATES PATENT AND TRADEMARK OFFICE
CERTIFICATE OF CORRECTION

PATENT NO. : 7,902,678 B2
APPLICATION NO. : 10/594844
DATED : March 8, 2011
INVENTOR(S) : Akira Ohuchi and Tomoo Murakami Page 1 of 1

It is certified that error appears in the above-identified patent and that said Letters Patent is hereby corrected as shown below:

In the Specification

Column 14, Line 48: delete "was bumps" and insert -- was 50 μm. Bumps --

Signed and Sealed this
Thirtieth Day of July, 2013

Teresa Stanek Rea
*Acting Director of the United States Patent and Trademark Office*